United States Patent
Mantani et al.

(10) Patent No.: US 12,439,527 B2
(45) Date of Patent: Oct. 7, 2025

(54) MOUNTING BOARD MANUFACTURING METHOD AND FLUX COATING DEVICE

(71) Applicant: Panasonic Intellectual Property Management Co., Ltd., Osaka (JP)

(72) Inventors: Masayuki Mantani, Saga (JP); Tadahiko Sakai, Fukuoka (JP); Tadashi Maeda, Fukuoka (JP); Yuki Yoshioka, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 414 days.

(21) Appl. No.: 18/043,955

(22) PCT Filed: Jul. 5, 2021

(86) PCT No.: PCT/JP2021/025337
§ 371 (c)(1),
(2) Date: Mar. 3, 2023

(87) PCT Pub. No.: WO2022/054384
PCT Pub. Date: Mar. 17, 2022

(65) Prior Publication Data
US 2024/0015893 A1    Jan. 11, 2024

(30) Foreign Application Priority Data

Sep. 14, 2020  (JP) .............................. 2020-154141
Sep. 14, 2020  (JP) .............................. 2020-154142

(51) Int. Cl.
*H05K 3/34*  (2006.01)
*H05K 1/18*  (2006.01)
*H05K 3/12*  (2006.01)

(52) U.S. Cl.
CPC ........... *H05K 3/3485* (2020.08); *H05K 1/181* (2013.01); *H05K 3/1275* (2013.01);
(Continued)

(58) Field of Classification Search
CPC ...... H05K 1/181; H05K 3/341; H05K 3/3485; H05K 3/3489; H05K 2203/0143; H05K 2203/0195; B23K 3/00
See application file for complete search history.

(56) References Cited

U.S. PATENT DOCUMENTS

| | | | | | |
|---|---|---|---|---|---|
| 5,785,234 | A | * | 7/1998 | Weiss | ...................... H01L 24/83 257/E21.511 |
| 2024/0196545 | A1 | * | 6/2024 | Yoshioka | ................. H05K 3/34 |

FOREIGN PATENT DOCUMENTS

| | | |
|---|---|---|
| JP | H08-250846 A | 9/1996 |
| JP | H09-321425 A | 12/1997 |
| JP | 2005-116917 A | 4/2005 |

OTHER PUBLICATIONS

International Search Report issued in Patent Application No. PCT/JP2021/025337 dated Aug. 31, 2021.

* cited by examiner

*Primary Examiner* — Nathan Milakovich
(74) *Attorney, Agent, or Firm* — MCDONALD HOPKINS LLC

(57) ABSTRACT

A mounting substrate manufacturing method for soldering a terminal of an electronic component to a land 2 of a substrate 1 includes: a paste disposing step of disposing a solder paste on the land 2; a melting and solidifying step of melting and solidifying the solder paste, to form a precoated area 3 coated with solder, on the land 2; a breaking step of breaking a residue covering a surface of the precoated area 3 by pressing a tool 432, 442 against the precoated area 3; a flux disposing step of disposing a flux F on the precoated area 3;
(Continued)

a component placement step of placing an electronic component on the substrate 1, with the terminal of the electronic component aligned with the precoated area 3; and a reflow step of heating the substrate 1 to melt the precoated area 3, to solder the terminal to the land 2. This can provide a mounting substrate manufacturing method that can reduce the occurrence of soldering defects.

13 Claims, 10 Drawing Sheets

(52) U.S. Cl.
CPC ... *H05K 3/3489* (2013.01); *H05K 2203/0143* (2013.01); *H05K 2203/0195* (2013.01)

MOUNTING BOARD MANUFACTURING METHOD AND FLUX COATING DEVICE

TECHNICAL FIELD

The present disclosure relates to a mounting substrate manufacturing method and a flux applying device.

BACKGROUND ART

Conventionally, as one of the steps included in the method for manufacturing a mounting substrate (a substrate with electronic components mounted thereon; the same applies hereinafter), a step of applying a flux to a solder precoated area of the substrate is known (e.g., Patent Literature 1). In this literature, a substrate having a solder precoated area formed on a land (hereinafter also sometimes referred to as a solder precoated substrate) is prepared, and a flux is applied to the precoated area.

CITATION LIST

Patent Literature

[PTL 1] Japanese Laid-Open Patent Publication No. JP H8-250846 A

SUMMARY OF INVENTION

Technical Problem

Incidentally, in manufacturing a solder precoated substrate, a residue is left on the surface of the precoated area. This residue is usually removed in a cleaning step performed prior to the flux applying step. However, in the solder precoated sub state from which the residue has been removed, the precoated area may be disadvantageously exposed to air and oxidized. When the precoated area is oxidized, defects are likely to occur in the subsequent soldering of electronic components. Under such circumstances, one object of the present disclosure is to provide a mounting substrate manufacturing method that can reduce the occurrence of soldering defects.

Solution to Problem

One aspect of the present disclosure relates to a mounting substrate manufacturing method for soldering a terminal of an electronic component to a land of a substrate. The mounting substrate manufacturing method includes: a paste disposing step of disposing a solder paste on the land; a melting and solidifying step of melting and solidifying the solder paste, to form a precoated area coated with solder, on the land; a breaking step of breaking a residue covering a surface of the precoated area by pressing a tool against the precoated area; a flux disposing step of disposing a flux on the precoated area; a component placement step of placing an electronic component on the substrate, with the terminal of the electronic component aligned with the precoated area; and a reflow step of heating the substrate to melt the precoated area, to solder the terminal to the land.

Advantageous Effects of Invention

According to the present disclosure, it is possible to provide a mounting substrate manufacturing method that can reduce the occurrence of soldering defects.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
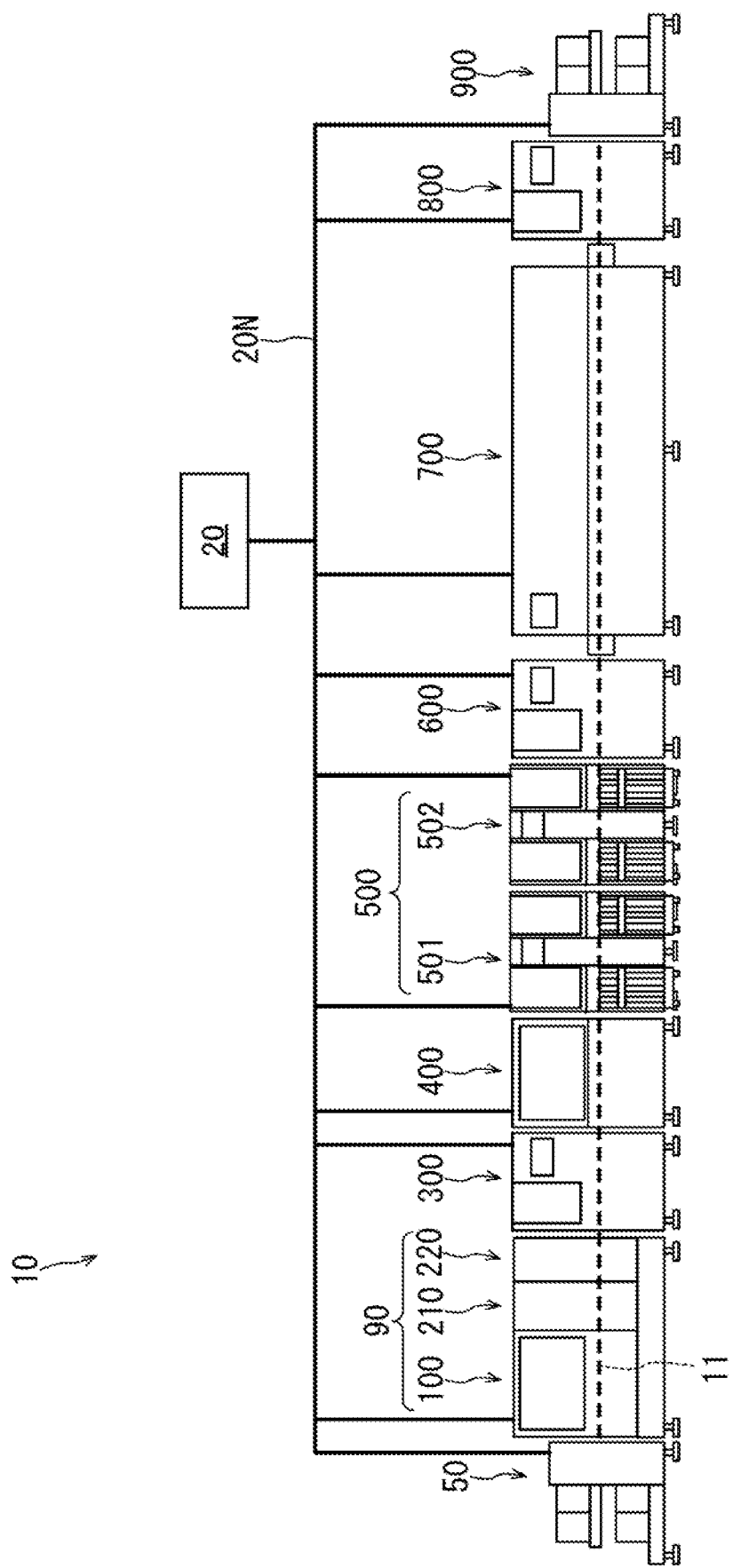
FIG. 1 A front view schematically showing a configuration of a mounting substrate manufacturing apparatus of Embodiment 1.

Embodiments of a mounting substrate manufacturing method and a flux applying device according to the present disclosure will be described below by way of examples. It is to be noted, however, that the present disclosure is not limited to the examples described below. In the description below, specific numerical values and materials are exemplified in some cases, but other numerical values and materials may be applied as long as the effects of the present disclosure can be achieved.

Mounting Substrate Manufacturing Method

The mounting substrate manufacturing method according to the present disclosure is a mounting substrate manufacturing method for soldering a terminal of an electronic component to a land of a substrate, and includes: a paste disposing step of disposing a solder paste on the land; a melting and solidifying step of melting and solidifying the solder paste, to form a precoated area coated with solder, on the land; a breaking step of breaking a residue covering a surface of the precoated area by pressing a tool against the precoated area; a flux disposing step of disposing a flux on the precoated area; a component placement step of placing an electronic component on the substrate, with the terminal of the electronic component aligned with the precoated area; and a reflow step of heating the substrate to melt the precoated area, to solder the terminal to the land.

Through the paste disposing step and the melting and solidifying step, a solder precoated substrate is manufactured. In the breaking step, the residue covering the surface of the precoated area is broken by pressing with a tool. At this time, cracks occur in the residue, and at least part of the precoated area is exposed from the cracks. In this sense, the breaking step of the present disclosure can be rephrased as "an exposing step of exposing at least part of the precoated area by breaking the residue covering the surface of the precoated area with a tool pressed against the precoated area." Then, through the subsequent flux disposing step, component placement step, and reflow step, a mounting substrate is manufactured.

In the above manufacturing process, before the breaking step is executed the residue is left on the surface of the precoated area. That is, until executing the breaking step, there is substantially no chance for the precoated area to be exposed to air, and the precoated area substantially stays unoxidized. With respect to the substrate having such an unoxidized precoated area, the flux disposing step, component placement step, and reflow step are executed. Therefore, defects are less likely to occur in the soldering of an electronic component in the reflow step.

As described above, according to the present disclosure, a mounting substrate manufacturing method that can reduce the occurrence of soldering defects can be obtained. Furthermore, according to the present disclosure, the usually performed residue cleaning step can be omitted, and the manufacturing cost of the mounting substrate can be reduced.

In the breaking step, the top portion of the precoated area may be made into a flat shape or an uneven shape with the tool. This eases the placement of an electronic component on the precoated area. In the present specification, the "uneven shape" refers to a shape having unevenness while being approximately flat as a whole.

The flux disposing step may be executed with a flux disposing device for disposing a flux on a substrate, and the breaking step may be executed with a pressing device included in the flux disposing device. In this case, since the breaking step and the flux disposing step are both executed with the flux disposing device, there is almost no time interval between the execution of the breaking step and the execution of the flux disposing step. That is, the time during which the precoated area having been at least partially exposed by the breaking step is exposed to air is shortened. Therefore, it is possible to further reduce the occurrence of soldering defects due to the oxidation of the precoated area.

The flux disposing step may be executed within 30 seconds after the execution of the breaking step. This shortens the time during which the precoated area having been at least partially exposed by the breaking step is exposed to air. Therefore, it is possible to further reduce the occurrence of soldering defects due to the oxidation of the precoated area.

Flux Applying Device

The flux applying device according to the present disclosure is a flux applying device for use in the above-described mounting substrate manufacturing method and for applying, by screen printing, a flux onto a precoated area coated with solder and formed on a substrate, and includes a tool that is pressed against a residue covering the surface of the precoated area before applying the flux, to break the residue.

The residue covering the surface of the precoated area is broken by the tool, and at least part of the solder inside the residue is exposed. Then, within the flux applying device, a crushing process accompanied by such a break and a flux application process are executed without a long time interval therebetween. This can prevent the exposed solder from being exposed to air and oxidized, and eventually, can prevent soldering defects from occurring after the placement of an electronic component.

The flux applying device may further include: a mask covering a region of the substrate to be left unapplied with the flux, and having a pattern hole passing through the mask in a thickness direction of the mask; a printing head having at least one squeegee for applying the flux disposed on the mask to the precoated area through the pattern hole; a printing stage holding the substrate; and a horizontal movement mechanism for horizontally moving the tool with respect to the substrate held on the printing stage.

The flux applying device may further include a camera for imaging the substrate. The horizontal movement mechanism may be a camera moving mechanism for horizontally moving the camera above the substrate held on the printing stage. In this case, the horizontal movement mechanism is configured such that the tool moves horizontally along with the horizontal movement of the camera. For example, a mechanism having a tool (e.g., a roller mechanism having a roller) may be fixed to the camera moving mechanism. In this way, the camera moving mechanism can be equipped with a function of horizontally moving the tool.

The flux applying device may further include a printing head moving mechanism for moving the printing head in a horizontal direction with respect to the mask. Alternatively, the tool may be provided on the printing head, and the horizontal movement mechanism may also serve as the printing head moving mechanism. According to the latter configuration, the tool moves horizontally along with the horizontal movement of the printing head. In this way, the printing head movement mechanism can be equipped with a function of horizontally moving the tool.

The printing head may have a first squeegee for applying the flux to the precoated area while horizontally moving in a first direction, and a second squeegee for applying the flux to the precoated area while horizontally moving in a second direction opposite to the first direction. The tool may be provided between the first squeegee and the second squeegee. When applying the flux with the first squeegee, the tool moving in the first direction and the first squeegee are pressed in this order against the precoated area. When applying the flux with the second squeegee, the tool moving in the second direction and the second squeegee are pressed in this order against the precoated area. In this way, by making the movements symmetrical to each other, the moving distance of the first and second squeegees can be shortened.

The tool may be, while moving horizontally together with the first squeegee and the second squeegee, pressed against the precoated area with the mask therebetween. In this case, the mask can serve as a spacer, which can prevent the precoated area from being excessively crushed by the tool. Furthermore, the flux can be applied to the precoated area without a long time interval after the breaking of the residue. This can prevent the solder at the precoated area from being exposed to air and oxidized, and eventually, can prevent soldering defects from occurring after the placement of an electronic component.

The flux applying device may further include a printing stage moving mechanism for horizontally moving the printing stage. The horizontal movement mechanism may be the printing stage moving mechanism. With this configuration, the tool moves horizontally along with the horizonal movement of the printing stage. In this way, the printing stage moving mechanism can be equipped with a function of horizontally moving the tool.

The tool may be a roller that moves horizontally with respect to the substrate. In this case, the precoated area, the residue at the surface of which is to be broken by the roller, refers only to an area that comes in contact with the outer peripheral surface of the roller. In other words, with the roller, the whole residue of the precoated area on the substrate will not be broken all at once. Thus, it is possible to prevent an excessive load from being applied to the substrate.

The roller may have unevenness on the outer peripheral surface. With such a roller, the top portion of the precoated area is crushed into a shape having unevenness while being flat as a whole. When a flux is applied to the precoated area, the flux enters the unevenness at the top portion. The viscosity of the flux that has entered the unevenness helps to further ease the placement of an electronic component.

The tool may be a horizontal plate that moves vertically with respect to the substrate. In this case, due to the vertical movement of at least one of the substrate and the horizontal plate, the top portion of the precoated area is crushed by the horizontal plate, and the residue at the surface of the precoated area is crushed.

The roller may be pressed against the precoated area, while moving horizontally. In this case, due to the horizontal movement of the roller, the top portion of the precoated area is crushed by the roller, and the residue at the surface of the precoated area is broken.

The roller may be fixed so as to be pressed against the precoated area of the substrate that moves horizontally. In this case, due to the horizontal movement of the substrate, the top portion of the precoated area is crushed by the roller, and the residue at the surface of the precoated area is broken.

In the following, examples of the mounting substrate manufacturing method and the flux applying device according to the present disclosure will be specifically described with reference to the drawings. To the processes and constituent elements of the below-described examples of the mounting substrate manufacturing method and the flux applying device, the processes and constituent elements as described above can be applied. The processes and constituent elements of the below-described examples of the mounting substrate manufacturing method and the flux applying device can be modified based on the description above. The matters as described below may be applied to the above embodiments. Of the processes and constituent elements of the below-described examples of the mounting substrate manufacturing method and the flux applying device, the processes and constituent elements which are not essential to the mounting substrate manufacturing method and the flux applying device according to the present disclosure may be omitted. The figures below are schematic and not intended to accurately reflect the shape and the number of the actual members.

Embodiment 1

Embodiment 1 of the present disclosure will be described. A mounting substrate manufacturing apparatus 10 (hereinafter also sometimes simply referred to as a manufacturing apparatus 10) of the present embodiment is an apparatus for manufacturing a mounting substrate with a plurality of electronic components mounted thereon.

Mounting Substrate Manufacturing Apparatus

As shown in FIG. 1, the manufacturing apparatus 10 includes a substrate transfer line 11, an information processing device 20, a loader 50, a solder precoat forming device 90, a solder precoat inspection device 300, a flux applying device 400, electronic component placing devices 501 and 502, a placed state inspection device 600, a reflow device 700, a substrate inspection device 800, and an unloader 900. Constituent elements from the loader 50 to the unloader 900 are disposed in the order as mentioned above, from the upstream side toward the downstream side. To the configuration other than the configurations specific to the present disclosure, a known configuration may be applied. Hereinafter, the electronic component placing devices 501 and 502 are sometimes collectively referred to as an electronic component placing device 500.

Substrate Transfer Line

The substrate transfer line 11 transfers a substrate 1 (see FIG. 2) from the solder precoat forming device 90 through the substrate inspection device 800. The substrate transfer line 11 may be a single continuous conveyor, or may be configured by arranging two or more conveyors in series. For the substrate transfer line 11, a conveyor including a known belt, chain, roller, transfer device, or the like can be used.

Information Processing Device

The information processing device 20 is communicably connected, via a wired or wireless local area network 20N, to other devices included in the manufacturing apparatus 10 (e.g., the solder precoat forming device 90, the solder precoat inspection device 300, the flux applying device 400, the electronic component placing device 500, the reflow device 700). The information processing device 20 exchanges data with these devices. Through this operation, the information processing device 20 manages the processes performed in the manufacturing apparatus 10.

The information processing device 20 has an arithmetic processing unit and a storage unit. The arithmetic processing unit is constituted of a CPU (central processing unit) and the like. The storage unit is constituted of one or more RAMs (random access memories), a hard disk, and the like. These may be constituted of a separate circuit or an LSI (large scale integrated circuit), or may be integrally configured. The storage unit stores a program necessary for each device in the manufacturing apparatus 10, and data necessary for the program.

Loader and Unloader

The loader 50 supplies a substrate housed in a rack (not shown) to the solder precoat forming device 90. The unloader 900 collects the completed mounting substrate into a rack. Each device from the solder precoat forming device 90 to the substrate inspection device 800 includes a conveyor (substrate transfer line 11) for transferring a substrate. Each conveyor is disposed such that it can receive a substrate from a device on the upstream side (on the loader 50 side) and pass it to a device on the downstream side (on the unloader 900 side).

Solder Precoat Forming Device

Figure 5:
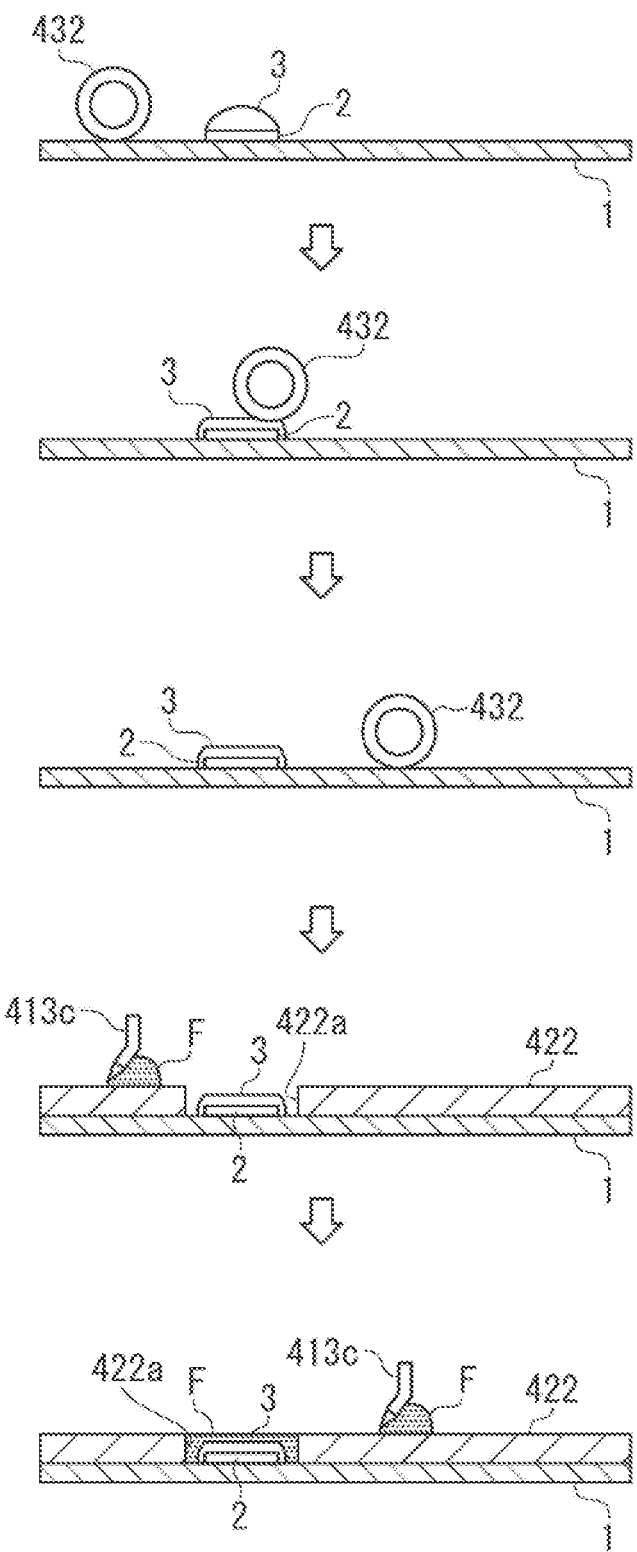
FIG. 5 A diagram for explaining a breaking step, a substrate disposing step, and a flux disposing step of Embodiment 1.

The solder precoat forming device 90 is a device that forms a precoated area 3 coated with solder (see FIG. 5) on the land 2 of the substrate 1 (see FIG. 5). The solder precoat forming device 90 has a solder paste supplying section 100, a heating section 210, and a cooling section 220. Inside these sections, part of the substrate transfer line 11 is disposed.

The solder paste supplying section 100 supplies a solder paste to the land 2 of the substrate 1 by, for example, screen printing. The heating section 210 heats the solder paste supplied to the land 2, to melt the solder particles contained in the solder paste. The cooling section 220 cools and solidifies the melted solder particles. As a result, the precoated area 3 coated with solder is formed on the land 2 of the substrate 1. Here, the precoated area 3 is accompanied by a reside of a flux component formed at its surface. This residue is formed from a thermoplastic resin contained in the flux, which becomes liquefied by the heating and spreads over the surface of the precoated area 3, and is then solidified into a film by the subsequent cooling. The substrate 1 with the precoated area 3 formed thereon is transferred to the solder precoat inspection device 300 by the substrate transfer line 11.

Solder Precoat Inspection Device

The solder precoat inspection device 300 is a device that inspects whether the precoated area 3 is properly formed or not. The solder precoat inspection device 300 may, for example, detect the thickness of the precoated area 3, to determine whether the precoated area 3 is properly formed or not, based on the detected thickness. The substrate 1 determined as having the precoated area 3 properly formed thereon is transferred to the flux applying device 400 by the substrate transfer line 11.

Flux Applying Device

The flux applying device 400 is a device that applies a flux for reflow soldering onto the precoated area 3. The method of flux application is not limited to a particular method. For example, the flux may be applied onto the precoated area 3 by screen printing using a mask and a squeegee, or by using a dispenser that discharges a flux from a nozzle, or using a sprayer that sprays a flux. The flux applying device 400 is one example of the flux disposing device. The configuration of the flux applying device 400 will be specifically described later. The substrate 1 with the flux applied thereon is transferred to the electronic component placing device 500 by the substrate transfer line 11.

Electronic Component Placing Device

The electronic component placing device 500 is a device that places an electronic component (not shown) on the precoated area 3 coated with flux. The electronic component placing device 500 may place an electronic component on the precoated area 3 using, for example, a suction nozzle (not shown) that sucks and holds an electronic component. The substrate 1 for which the placement of the electronic component has been completed is transferred to the placed state inspection device 600 by the substrate transfer line 11.

Placed State Inspection Device

The placed state inspection device 600 is a device for inspecting the placed state of the electronic component. The placed state inspection device 600 may use, for example, an optical measuring instrument, such as a camera or a three-dimensional measuring system, to recognize the placed state of the electronic component, such as the placed position, the posture, and the presence or absence of the electronic component, and determine whether they satisfy a predetermined standard. The substrate 1 for which the inspection has been completed is transferred to the reflow device 700 by the substrate transfer line 11.

Reflow Device

The reflow device 700 heats the substrate 1 with the electronic component placed thereon, to melt the precoated area 3, so that the electronic component is soldered onto the land 2 (see FIG. 5). In this way, a mounting substrate on which the electronic component is mounted is manufactured. The substrate 1 (mounting substrate) for which the soldering of the electronic component has been completed is transferred to the substrate inspection device 800 by the substrate transfer line 11.

Substrate Inspection Device

The substrate inspection device 800 is a device for inspecting whether the mounting substrate is good or not. The substrate 1 (mounting substrate) for which the inspection at the substrate inspection device 800 has been completed is transferred to the unloader 900 by the substrate transfer line 11. The unloader 900 collects the completed mounting substrate into a rack.

Details of Flux Applying Device

Next, the flux applying device 400 will be specifically described with reference to FIGS. 2 and 3. In the following description, the transferring direction of the substrate 1 is referred to as X direction, the vertical direction is referred to as Z direction, and the direction orthogonal to these directions is referred to as Y direction. Also, the axes extending along each direction are referred to as X-axis, Y-axis, and Z-axis, respectively.

Figure 2:
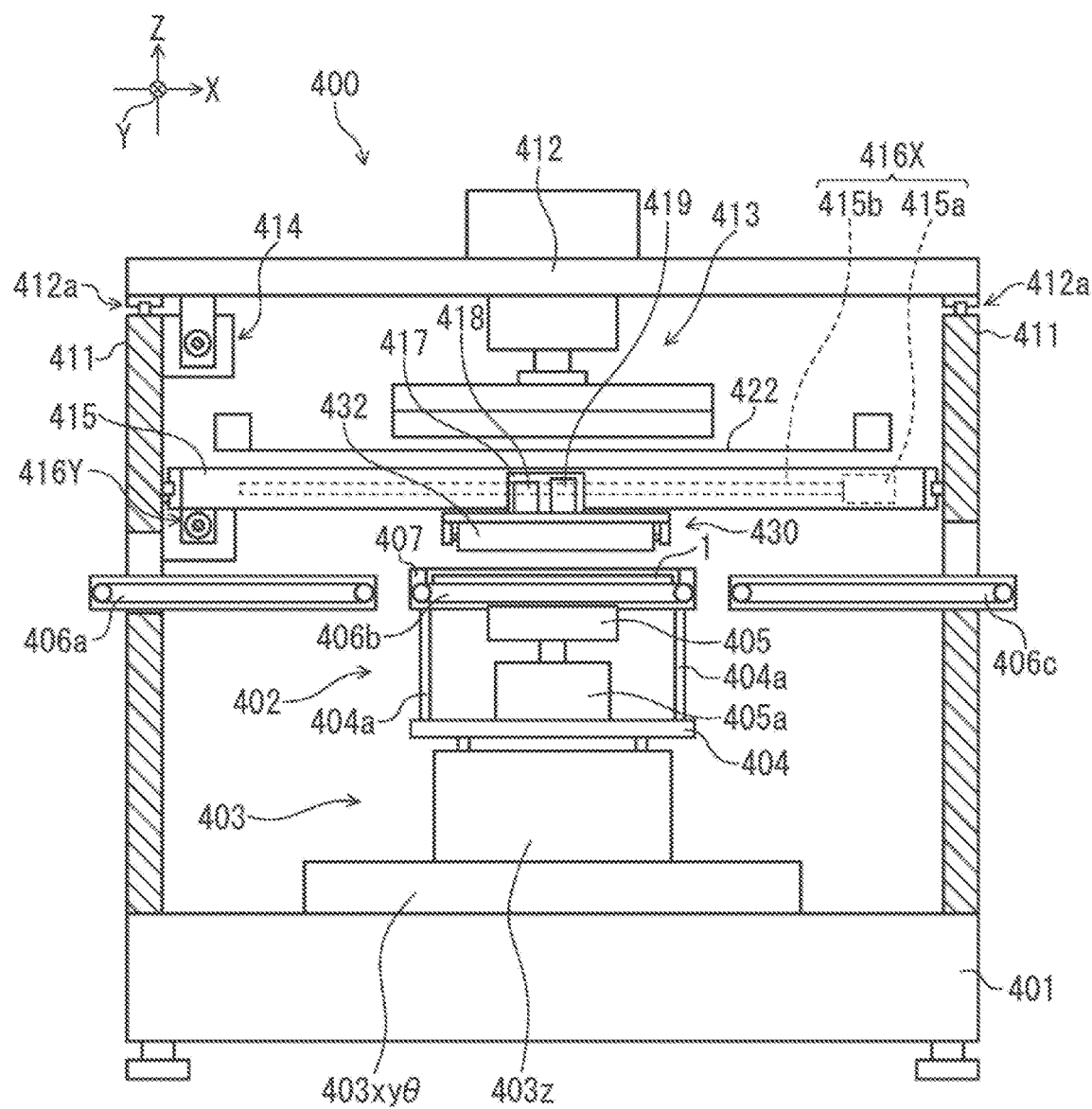
FIG. 2 front view schematically showing a configuration of a flux applying device of Embodiment 1.
Figure 3:
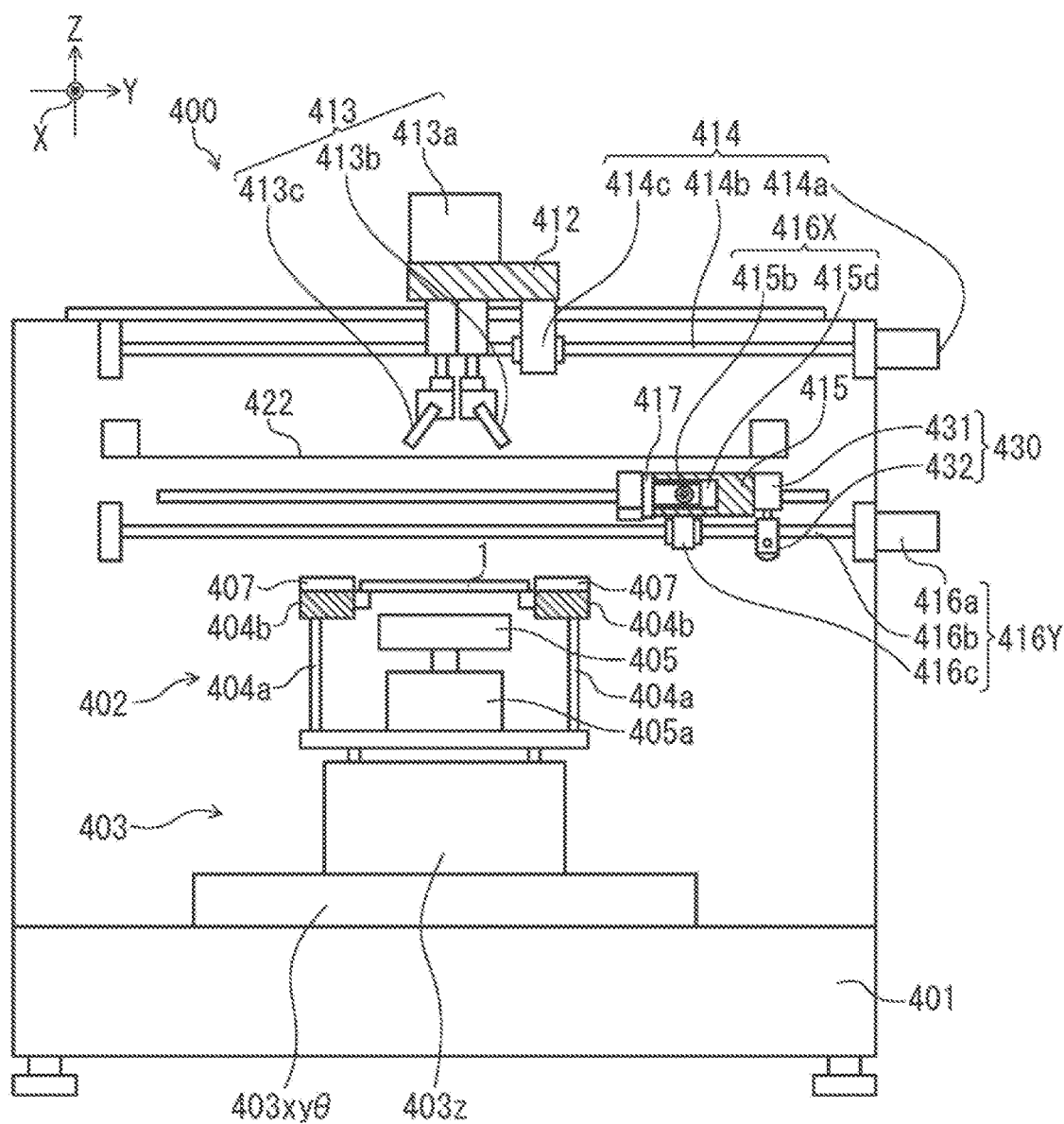
FIG. 3 A side view schematically showing a configuration of the flux applying device of Embodiment 1.

In FIGS. 2 and 3, on both side ends of a pedestal 401 in the X direction, support frames 411 are provided to stand, one on each end. Between a pair of these support frames 411, constituent elements of the flux applying device 400 are disposed.

On the upper surface of the pedestal 401 between the pair of the support frames 411, a printing stage moving mechanism 403, and a printing stage 402 moved by this mechanism is provided. The printing stage moving mechanism 403 has a structure including a printing stage table 403$xy\theta$ and a printing stage lifting mechanism 403$z$ stacked thereon. The printing stage table 403$xy\theta$ drives the printing stage 402 to horizontally move along the X- and Y-axes and rotate about the Z-axis. The printing stage lifting mechanism 403$z$ drives the printing stage 402 to move up and down. The printing stage 402 has a function of holding the substrate 1 carried in from the upstream side and aligning it with respect to a mask plate 422 having a pattern hole for printing (see FIG. 5) formed therein. The mask plate 422 is an example of the mask.

The printing stage 402 includes a lifting table 404 coupled to the printing stage lifting mechanism 403$z$. On both ends of the upper surface of the lifting table 404, supporting members 404$a$ are provided to stand. As shown in FIG. 3, holding blocks 404$b$ extending in the X direction are joined to the upper ends of the support members 404$a$. On the inner side surfaces of the holding blocks 404$b$, a printing stage conveyor 406$b$ with a drive belt for transferring the substrate 1 is provided The printing stage conveyor 406b is disposed to be connectable to a carry-in conveyor 406a and a carry-out conveyor 406c that are provided respectively on the upstream and downstream sides through openings provided in the support frames 411. The substrate 1 carried in by the carry-in conveyor 406a is passed onto the printing stage conveyor 406b and held by the printing stage 402. The substrate 1 having been subjected to screen printing on the printing stage 402 is passed onto the carry-out conveyor 406c from the printing stage conveyor 406b, and carried out. The printing stage conveyor 406b, the carry-in conveyor 406a, and the carry-out conveyor 406c each constitute a part of the substrate transfer line 11.

On the upper surface of the lifting table 404, a backup lifting mechanism 405a and a backup unit 405 driven to move up and down by the backup lifting mechanism are provided. When the backup lifting mechanism 405a is driven while the substrate 1 has been carried onto the printing stage conveyor 406b, the backup unit 405 rises to support the lower surface of the substrate 1 transferred by the printing stage conveyor 406b.

Side clampers 407 for gripping the side surfaces of the substrate 1 are provided on the upper surfaces of the pair of the holding blocks 404b. These side clampers 407 are configured to be mutually openable and closable by a side clamper driving mechanism (not shown). By allowing the side clampers 407 to perform a closing action, while the backup unit 405 is supporting the lower surface of the substrate 1, both side surfaces of the substrate 1 become sandwiched between the side clampers 407, on the printing stage 402. Thus, the substrate 1 is clamp-fixed.

For aligning the substrate 1 held by the printing stage 402 in this manner with the mask plate 422, an alignment operation of moving the printing stage 402 holding the substrate 1 with respect to the mask plate 422 for achieving alignment is performed. That is, the printing stage table 403$xy\theta$ that horizontally moves the printing stage 402 functions as an alignment mechanism for moving the printing stage 402 and the mask plate 422 with respect to each other in order to align the substrate 1 with the mask plate 422.

On the upper ends of the pair of support frames 411, a printing head support beam 412 that supports a printing head 413 is provided so as to be movable along the Y-axis via a linear motion guide mechanism 412a. One end of the printing head support beam 412 is joined to one of the support frames 411 via a printing head moving mechanism 414 configured as shown in FIG. 3. The printing head moving mechanism 414 is configured such that a nut part 414c screwed with a feed screw 414b, which is rotationally driven by a printing head motor 414a, is joined to the printing head support beam 412. When the printing head motor 414a is driven forward and backward, the printing head 413 supported by the printing head support beam 412 reciprocates along the Y-axis (squeegeeing operation).

As shown in FIG. 3, the printing head 413 includes a pair of a rear squeegee 413b and a front squeegee 413c provided so as to extend downward from the printing head support beam 412. When a squeegee driving unit 413a provided on the upper surface of the printing head support beam 412 is driven, either the rear squeegee 413b or the front squeegee 413c descends, depending on in which direction the squeegeeing operation is performed, and lands on the mask plate 422. Specifically, the rear squeegee 413b lands on the mask plate 422 when the squeegeeing operation is performed in the left direction (first direction) in FIG. 3. On the other hand, the front squeegee 413c lands on the mask plate 422 when the squeegeeing operation is performed in the right direction (second direction) in FIG. 3. The rear squeegee 413b is an example of the first squeegee. The front squeegee 413c is an example of the second squeegee. The rear squeegee 413b and the front squeegee 413c are each an example of an application unit.

The mask plate 422 is provided with a pattern hole 422a which is a predetermined opening, corresponding to the printing pattern on the substrate 1. In the screen printing in the flux applying device 400, first, a flux F for printing is supplied onto the upper surface of the mask plate 422 (see FIG. 4A etc.). Then, while the substrate 1 held by the printing stage 402 is in abutment with the lower surface of the mask plate 422, the squeegeeing operation using either the rear squeegee 413b or the front squeegee 413c is performed on the upper surface of the mask plate 422. In this way, on the substrate 1, the flux F is printed in a predetermined printing pattern through the pattern hole 422a.

A camera moving mechanism 416 is provided between the upper surface of the printing stage 402 and the lower surface of the mask plate 422. The camera moving mechanism 416 drives a camera attachment base 417 to which a first camera 418 and a second camera 419 are attached, to move along the X- and Y-axes. The camera moving mechanism 416 is constituted of a camera X-axis moving mechanism 416X for moving the camera attachment base 417 along the X-axis, along a camera X-axis beam 415, and a camera Y-axis moving mechanism 416Y for moving the camera X-axis beam 415 along the Y-axis. The movement of the camera X-axis beam 415 is guided by a linear motion guide mechanism 412a disposed on an inner surface of the support frame 411.

The camera X-axis movement mechanism 416X is constituted of a camera X-axis motor 415a and a feed screw 415b shown in FIG. 2, and a nut part 415d shown in FIG. 3. The camera X-axis motor 415a drives the camera attachment base 417 joined to the nut part 415d, to move along the X-axis. The camera Y-axis movement mechanism 416Y is constituted of, as shown in FIG. 3, a camera Y-axis motor 416a, a feed screw 416b, and a nut part 416c joined to the camera X-axis beam 415. The camera Y-axis motor 416a drives the camera X-axis beam 415 joined to the nut part 416c, to move along the Y-axis. In this way, the first camera 418 horizontally moves above the substrate 1 held on the printing stage 402, and the second camera 419 horizontally moves below the mask plate 422.

Here, the functions of the first camera 418 and the second camera 419 will be described. The first camera 418 is disposed with its imaging direction directed downward, and images the substrate 1 held on the printing stage 402. By performing recognition processing of the imaging result, the position of the substrate 1 and the position of an electrode which is an object to be printed, on the substrate 1 can be detected. The second camera 419 is disposed with its imaging direction directed upward, and images a mask recognition mark (not shown) formed on the mask plate 422. By performing recognition processing of the imaging result, the positions of the mask center in the mask plate 422 and the pattern hole 422a can be recognized.

A roller mechanism 430 is fixed to the side surface of the camera X-axis beam 415. The roller mechanism 430 has a press cylinder 431 and a roller 432 coupled to each other. The press cylinder 431 is fixed to the camera X-axis beam 415 and applies a downward force to the roller 432. The roller 432 extends along the X-axis and is rotatable about the rotation axis extending in the X direction. The roller mechanism 430 including the roller 432 moves horizontally along the X- and Y-axes along with the horizonal movement of the camera X-axis beam 415. The roller mechanism 430 has a function of crushing the top portion of the precoated area 3 of the substrate 1 by, while moving horizontally, pressing the roller 432 against the substrate 1 with the press cylinder 431. The roller mechanism 430 is an example of the pressing device. The roller 432 is an example of the tool. Furthermore, in the present embodiment, the camera Y-axis movement mechanism 416Y functions as a horizontal movement mechanism for horizontally moving the roller 432 with respect to the substrate 1 held on the printing stage 402.

Mounting Substrate Manufacturing Method

Next, the mounting substrate manufacturing method of the present embodiment will be described with reference to the drawings as appropriate. The mounting substrate manufacturing method includes a paste disposing step, a melting and solidifying step, a holding step, a breaking step, a substrate disposing step, a flux disposing step, a component placement step, and a reflow step.

The paste disposing step is executed in the solder paste supplying section 100. In the paste disposing step, a solder paste is disposed on the land 2 of the substrate 1 by, for example, flux printing.

The melting and solidifying step is executed in the heating section 210 and the cooling section 220. In the melting and solidifying step, the heating unit 210 heats and melts the solder paste, and the cooling unit 220 cools and solidifies the melted solder paste, thereby forming the precoated area 3 on the land 2.

Figure 4A:
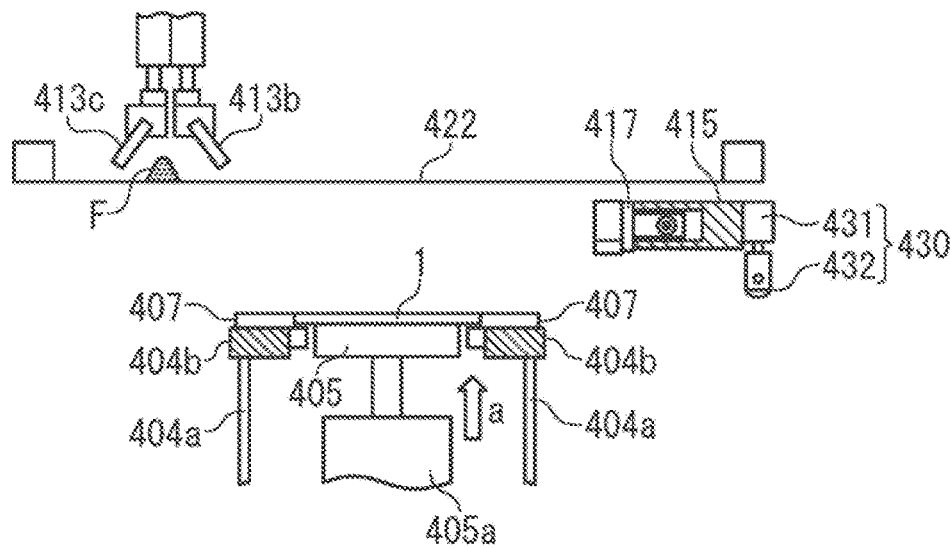
FIG. 4A diagram for explaining a holding step.

The holding step, the breaking step, the substrate disposing step, and the flux disposing step are executed by the flux applying device 400. In the holding step, the substrate 1 is held by the backup unit 405 and the side clampers 407. In the holding step, as shown in FIG. 4A, in the printing stage 402, the backup lifting mechanism 405a is driven to raise the backup unit 405 (arrow a), and the side clamper driving mechanism (not shown) is driven to allow the side clampers 407 to perform a closing action. In this way, the substrate 1, with its upper surface is aligned substantially flush with the upper surfaces of the side clampers 407, is supported at its lower surface by the backup unit 405, and gripped at its side surfaces by the side clampers 407.

Figure 4B:
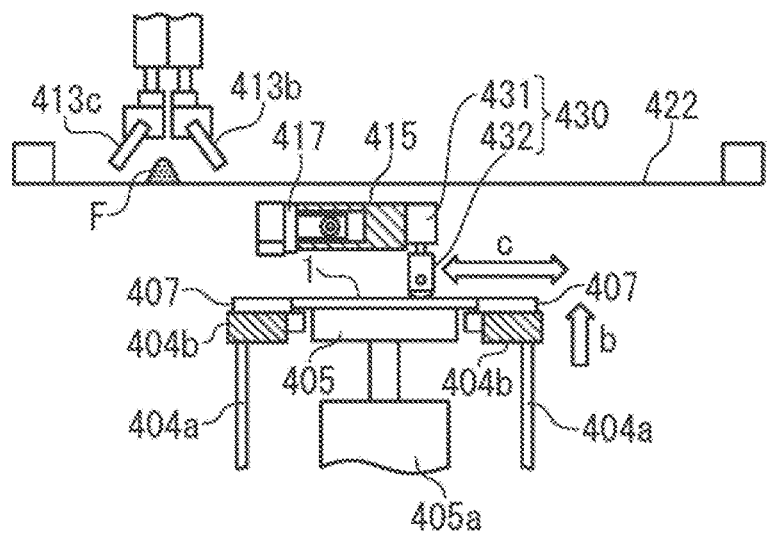
FIG. 4B A diagram for explaining a breaking step.

In the breaking step, the roller 432 is pressed against the precoated area 3, to crush the precoated area 3. In the breaking step, as shown in FIG. 4B, the printing stage lifting mechanism 403z is driven to raise the printing stage 402 (arrow b), and then, with a downward force applied to the roller 432 with the pressing cylinder 431, the roller 432 is pressed against the substrate 1 while being moved along the Y-axis (arrow c). In this way, as shown in FIG. 5, the top portion of the precoated area 3 of the substrate 1 is crushed into a flat shape. At this time, for example, cracks occur in the residue present in the form of a film at the top portion of the precoated area 3, and the residue is crushed. This allows at least part of the solder to be exposed from the cracks. In the breaking step of the present embodiment, the precoated area 3 is crushed to be thinner than the thickness of the mask plate 422. In the breaking step, the precoated area 3 may be crushed to be thicker than the thickness of the mask plate 422 or may be crushed to be the same thickness as the thickness of the mask plate 422.

Figure 4C:
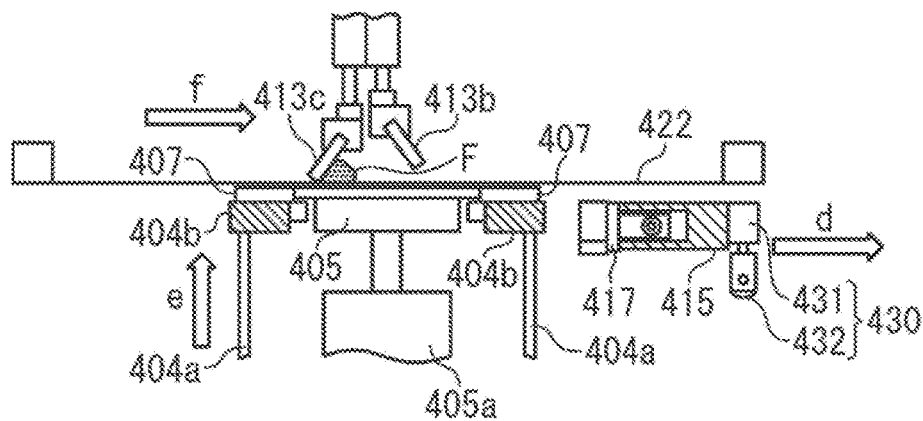
FIG. 4C A diagram for explaining a substrate disposing step and a flux disposing step.

In the substrate disposing step, the substrate 1 is brought into abutment with the lower surface of the mask plate 422. In the substrate disposing step, as shown in FIG. 4C, the roller mechanism 430 is retracted (arrow d), and then, the printing stage 402 is raised, and the substrate 1, which is held by the backup unit 405 and the side clampers 407, is brought into abutment with the lower surface of the mask plate 422 (arrow e). At this time, the supplied flux F is on the upper surface of the mask plate 422, and the front squeegee 413c for performing the squeegeeing operation is in the printing stand-by position.

In the flux disposing step, the flux F is applied to the crushed precoated area 3 through the mask plate 422, with the rear squeegee 413b or the front squeegee 413c. In the flux disposing step, as shown in FIG. 4C, the printing head 413 is moved along the Y-axis on the upper surface of the mask plate 422 (arrow f), to execute a squeegeeing operation to fill the pattern hole 422a with the flux F, while, in this example, the front squeegee 413c is slid against the mask plate 422. In this way, as shown in FIG. 5, the flux F is applied to the precoated area 3 of the substrate 1 through the pattern hole 422a of the mask plate 422.

In the flux disposing step of the present embodiment, the flux F is applied with a certain thickness also onto the top portion of the precoated area 3. This is because the precoated area 3 is crushed to be thinner than the thickness of the mask plate 422 in the preceding breaking step.

The flux disposing step is preferably performed within 30 seconds after the execution of the breaking step, and more preferably performed within 10 seconds after the execution of the breaking step. In other words, the time duration from the end time of the breaking step to the start time of the flux disposing step is preferably within 30 seconds, more preferably within 10 seconds.

The component placement step is executed in the electronic component placing device 500. In the component placement step, an electronic component is placed on the substrate 1, with the terminal of the electronic component aligned with the precoated area 3. According to the mounting component manufacturing method of the present embodiment, the placement of an electronic component can be easily carried out. This is because the top portion of the precoated area 3 is in a flat shape, allowing for easy placement of an electronic component thereon, and in addition, the viscosity of the flux F helps the electronic component to be easily held on the precoated area 3.

The reflow step is executed in the reflow device 700. In the reflow step, the substrate 1 with an electronic component placed thereon is heated to melt the precoated area 3, so that the terminal of the electronic component is soldered to the land 2.

Embodiment 2

Embodiment 2 of the present disclosure will be described. The mounting substrate manufacturing apparatus 10 of the present embodiment differs from that of the above Embodiment 1 in that the configuration of the flux applying device 400 includes the roller mechanism 430 which is a fixed-type roller mechanism. In the following, the difference from the above Embodiment 1 will be mainly described.

Figure 6:
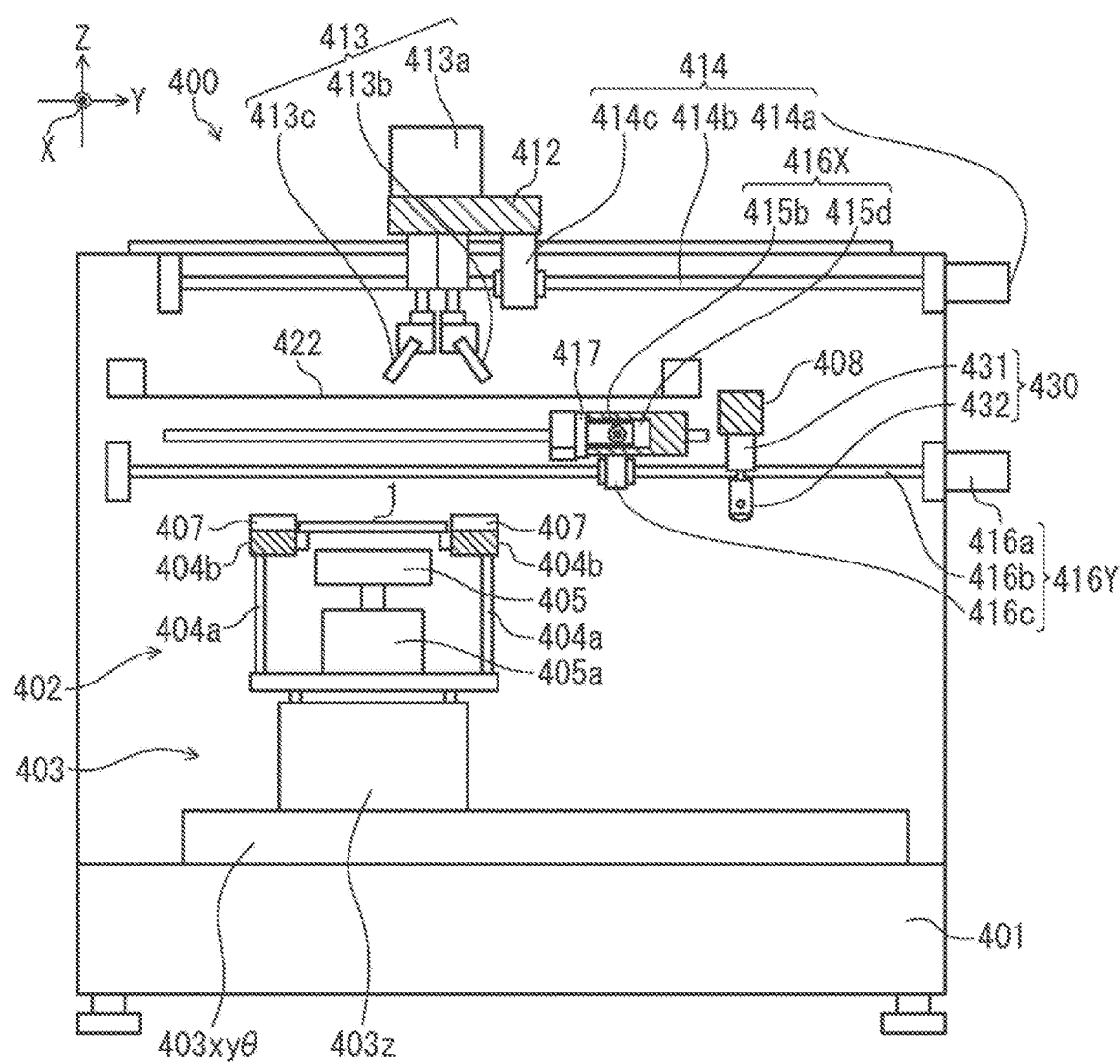
FIG. 6 A side view schematically showing a configuration of a flux applying device of Embodiment 2.

As shown in FIG. 6, the press cylinder 431 of the roller mechanism 430 is secured to a beam 408 fixed inside the flux applying device 400. Therefore, in the present embodiment, the roller 432 will not move along the Y-axis.

In the breaking step, the printing stage 402 is moved by the printing stage moving mechanism 403 from the printing position as shown in FIG. 6, to the breaking position (not shown). The breaking position is a position where the printing stage 402 is present below the roller mechanism 430. In the breaking step, with the printing stage 402 moved along the Y-axis, the roller 432 is pressed against the substrate 1 at the breaking position, thereby to crush the top portion of the precoated area 3 of the substrate 1. At this time, the residue on the surface is broken at the top portion of the precoated area 3, and at least part of the solder in its inside is exposed. In the present embodiment, the printing stage moving mechanism 403 functions as a horizontal movement mechanism for horizontally moving the roller 432 with respect to the substrate 1 held on the printing stage 402.

Embodiment 3

Embodiment 3 of the present disclosure will be described. The mounting substrate manufacturing apparatus 10 of the present embodiment differs from that of the above Embodiment 2 in the configuration of the tool for crushing the precoated area 3, in the flux applying device 400. In the following, the difference from the above Embodiment 2 will be mainly described.

Figure 7:
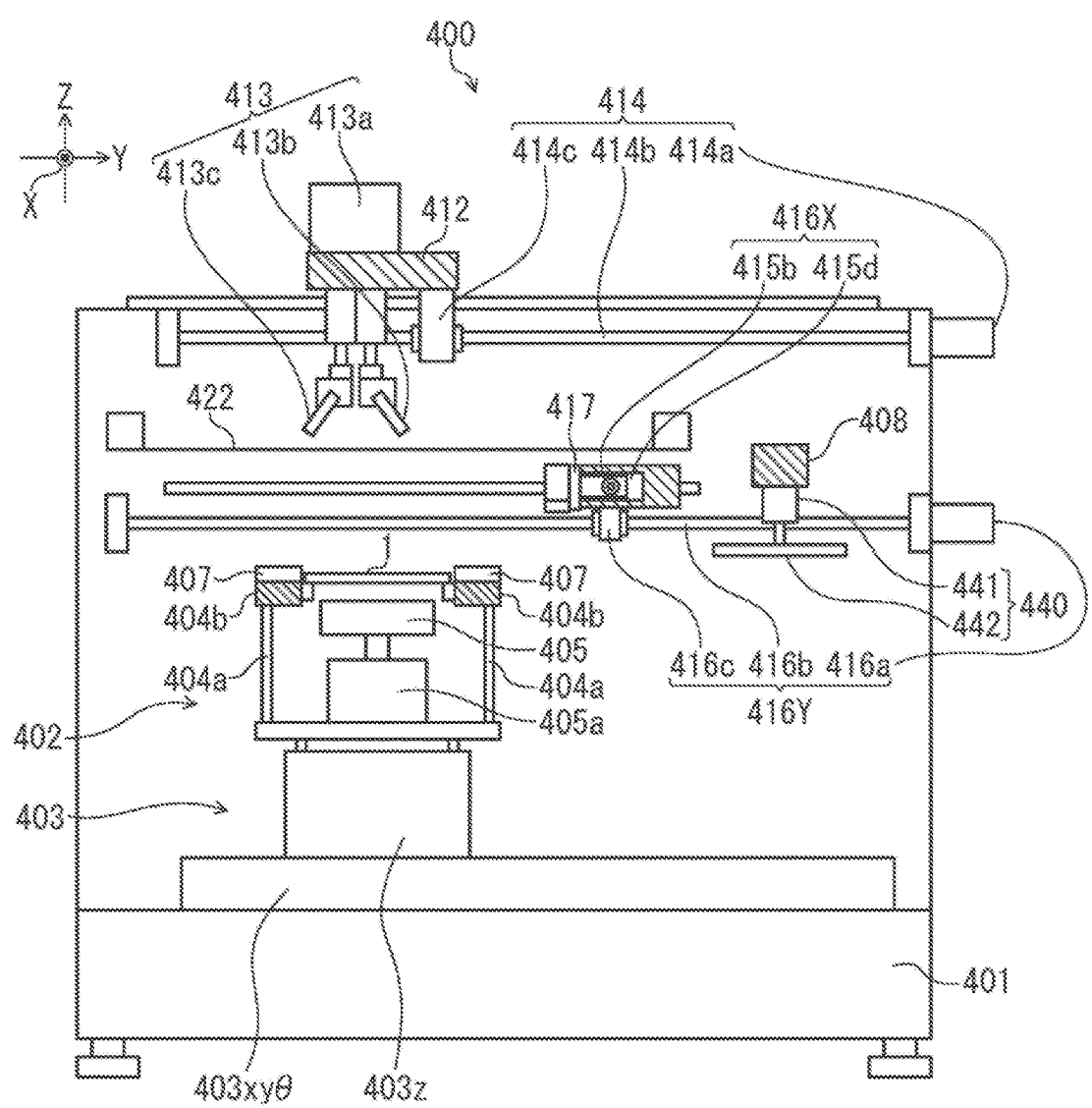
FIG. 7 A side view schematically showing a configuration of a flux applying device of Embodiment 3.

As shown in FIG. 7, a plate mechanism 440 is fixed to the beam 408. The plate mechanism 440 has a press cylinder 441 and a horizontal plate 442 which are coupled to each other. The press cylinder 441 is fixed to the beam 408 and applies a downward force to the horizontal plate 442. The horizontal plate 442 extends along the horizontal plane and is movable along the Z-axis. The lower surface of the horizontal plate 442 is approximately flat. The plate mechanism 440 has a function of crushing the top portion of the precoated area 3 of the substrate 1 by pressing the horizontal plate 442 against the substrate 1 at the breaking position by means of the press cylinder 441. The plate mechanism 440 is an example of the pressing device. The horizontal plate 442 is an example of the tool.

In the present specification, the term "approximately flat" includes not only a completely flat shape but also a shape having unevenness while being flat as a whole. For example, when the top portion of the precoated area 3 is crushed using the roller 432 having unevenness on its surface, the latter shape can be obtained.

Embodiment 4

Embodiment 4 of the present disclosure will be described. The mounting substrate manufacturing apparatus 10 of the present embodiment differs from that of the above Embodiment 1 in the configuration of the printing head 413 of the flux applying device 400 and the embodiment of a method of using the flux applying device 400. In the following, the difference from the above Embodiment 1 will be mainly described.

Flux Applying Device

Figure 8:
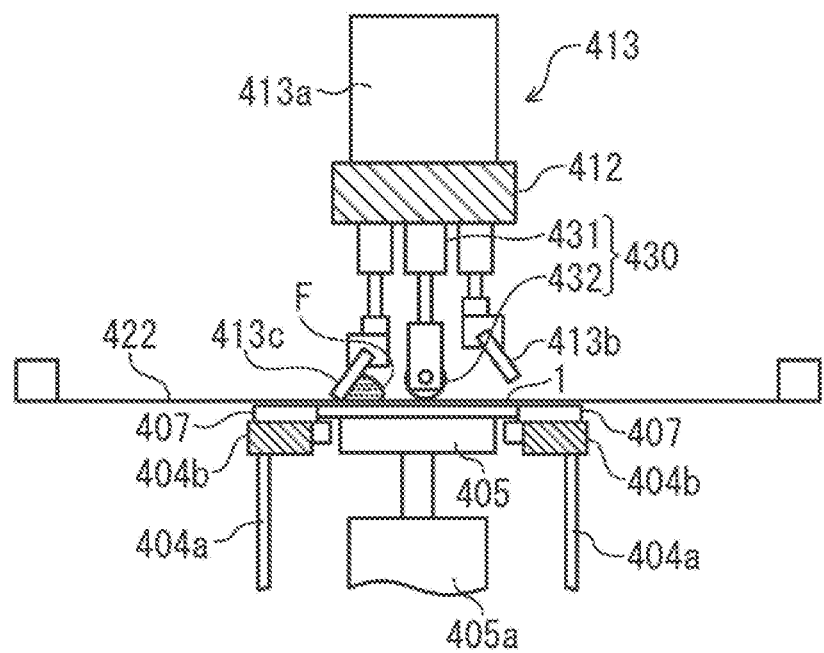
FIG. 8 A side view schematically showing an essential part of a flux applying device of Embodiment 4.

As shown in FIG. 8, the printing head 413 has the roller mechanism 430 which is provided between the rear squeegee 413b and the front squeegee 413c. Except for such a layout, the configuration of the roller mechanism 430 is the same as that of the above Embodiment 1. The roller mechanism 430, while horizontally moving together with the rear squeegee 413b and the front squeegee 413c, presses the roller 432 against the precoated area 3 of the substrate 1 through the mask plate 422. Note that the roller mechanism 430, in FIG. 8, may be provided on the right side of the rear squeegee 413b, or may be provided on the left side of the front squeegee 413c. When the roller 432 is provided integrally with the printing head 413 as in the present embodiment, the printing head moving mechanism 414 functions as a horizontal movement mechanism for horizontally moving the roller 432 with respect to the substrate 1 held on the printing stage 402.

Method of Using Flux Applying Device

Figure 9:
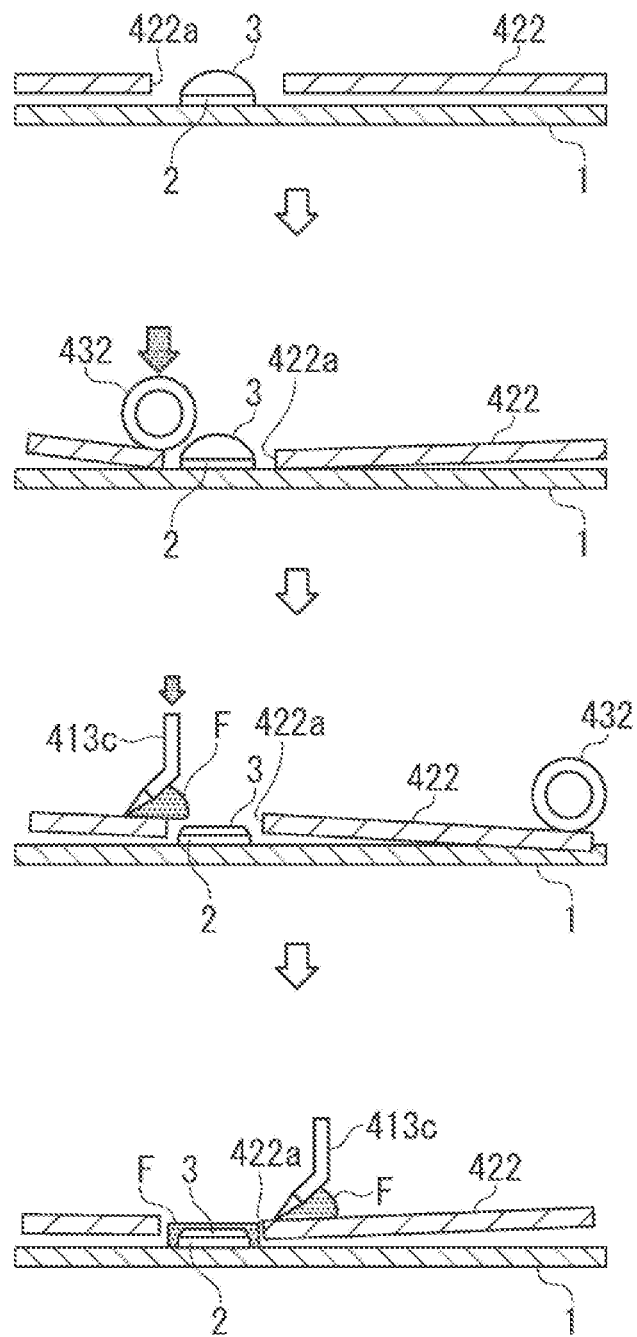
FIG. 9 A diagram for explaining a breaking step, a substrate disposing step, and a flux disposing step of Embodiment 4.

A method of using the flux applying device 400 of the present embodiment will be described with reference to FIG. 9. As shown in FIG. 9, the method of using the flux applying device 400 includes a holding step (here, illustration and description are omitted), a substrate disposing step, a breaking step, and a flux disposing step.

In the substrate disposing step, the substrate 1 is positioned below the mask plate 422, with a space left from the mask plate 422. In the substrate disposing step, as shown in the uppermost row of FIG. 9, with the printing stage 402 raised, the substrate 1 held by the backup unit 405 and the side clampers 407 is positioned below the mask plate 422, with a space left therefrom.

In the breaking step, the roller 432 is pressed against the precoated area 3 with a first load through the mask plate 422, to crush the precoated area 3. In the breaking step, as shown in the second and third rows from the top of FIG. 9, the printing head 413 is moved along the Y-axis, while pressing the roller 432 against the mask plate 422 with the relatively large first load. In this way, at a place where the roller 432 is pressed, the mask plate 422 is locally brought into close contact with the substrate 1. The thickness of the precoated area 3 crushed by the roller 432 moving as above becomes substantially the same as the thickness of the mask plate 422 or slightly thinner than that thickness. When the precoated area 3 is crushed, the residue on the surface is broken at the top portion of the precoated area 3, and at least part of the solder in its inside is exposed.

In the flux disposing step, a flux F is applied to the crushed precoated area 3 through the mask plate 422 with the rear squeegee 413b or the front squeegee 413c, with a second load smaller than the first load. In the flux disposing step, as shown in the third and fourth rows from the top of FIG. 9, the printing head 413 is moved in the Y-direction (second direction), while, in this example, the front squeegee 413c is pressed against the mask plate 422, with the relatively small second load. In this way, at the place where the front squeegee 413c is pressed, the mask plate 422 is more softly pressed down than in the above breaking step. When the flux F is filled into the pattern hole 422a by the front squeegee 413c moving as above, the flux F is applied with a certain thickness also onto the top portion of the precoated area 3. This can further ease the mounting of an electronic component by the electronic component mounting apparatus 500.

The flux disposing step is executed preferably within 30 seconds after the execution of the breaking step, and more preferably within 10 seconds after the execution of the breaking step. In other words, the time duration from the end time of the breaking step to the start time of the flux disposing step is preferably within 30 seconds, more preferably within 10 seconds.

Embodiment 5

Embodiment 5 of the present disclosure will be described. The mounting substrate manufacturing apparatus 10 of the present embodiment differs from that of the above Embodiment 4 in the configuration of the roller mechanism 430 of the flux applying device 400 and the embodiment of a method of using the flux applying device 400. In the following, the difference from the above Embodiment 4 will be mainly described.

Flux Applying Device

Figure 10:
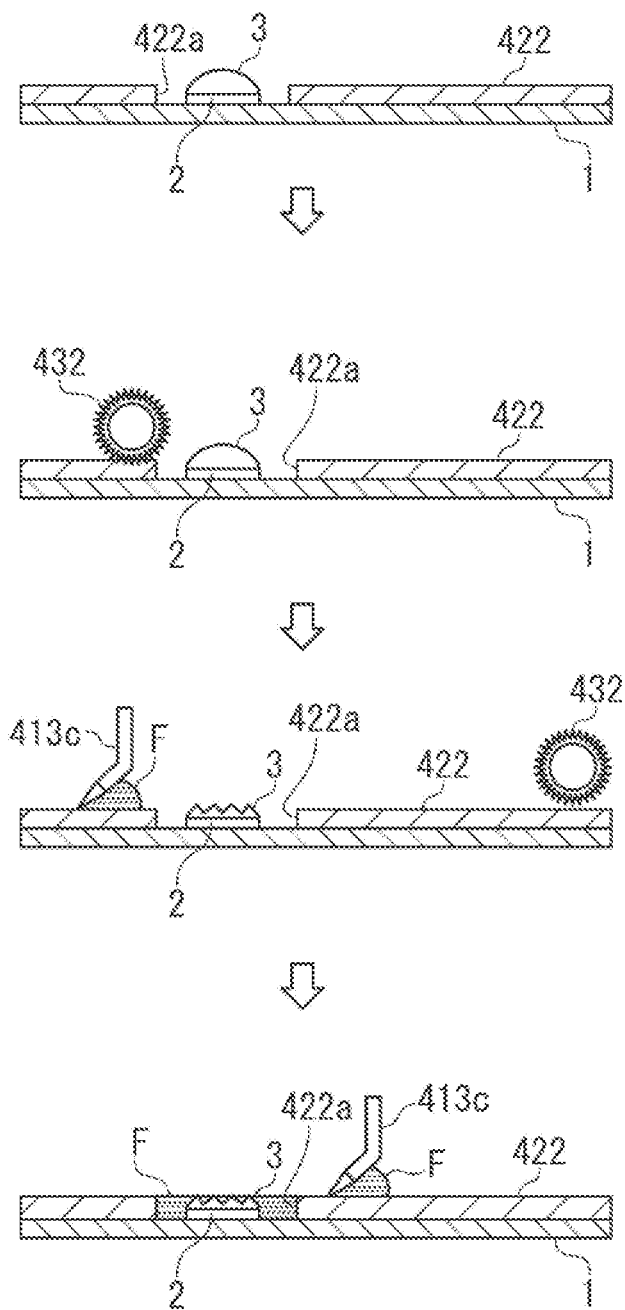
FIG. 10 A diagram for explaining a breaking step, a substrate disposing step, and a flux disposing step of Embodiment 5.

As shown in FIG. 10, the roller 432 of the roller mechanism 430 has unevenness on its outer peripheral surface. Except for this point, the configuration of the roller mechanism 430 is the same as that of the above Embodiment 4. The roller mechanism 430, while horizontally moving together with the rear squeegee 413*b* and the front squeegee 413*c*, presses the roller 432 against the precoated area 3 of the substrate 1 through the mask plate 422.

Method of Using Flux Applying Device

A method of using the flux applying device 400 of the present embodiment will be described with reference to FIG. 10. As shown in FIG. 10, the method of using the flux applying device 400 includes a holding step (here, illustration and description are omitted), a substrate disposing step, a breaking step, and a flux disposing step.

In the substrate disposing step, the substrate 1 is positioned under the mask plate 422, in contact with the mask plate 422. In the substrate disposing step, as shown in the uppermost row of FIG. 10, with the printing stage 402 raised, the substrate 1 held by the backup unit 405 and the side clampers 407 is positioned under the mask plate 422, in contact therewith.

In the breaking step, the roller 432 is pressed against the precoated area 3 with a first load through the mask plate 422, to crush the precoated area 3. In the breaking step, as shown in the second and third rows from the top of FIG. 10, the printing head 413 is moved along the Y-axis, while the roller 432 is pressed against the mask plate 422 with the relatively large first load. In this way, at a place where the roller 432 is pressed, the mask plate 422 locally compressed strongly. The thickness of the precoated area 3 crushed by the roller 432 moving as above becomes slightly thinner than the thickness of the mask plate 422. Also, since the roller 432 has unevenness on its outer peripheral surface, the top portion of the precoated area 3 is crushed into a shape with unevenness. When the precoated area 3 is crushed, the residue on the surface is broken at the top portion of the precoated area 3, and at least part of the solder in its inside is exposed.

In the flux disposing step, a flux F is applied to the crushed precoated area 3 through the mask plate 422 with the rear squeegee 413*b* or the front squeegee 413*c*, with a second load smaller than the first load. In the flux disposing step, as shown in the third and fourth rows from the top of FIG. 10, the printing head 413 is moved in the Y-direction (second direction), while, in this example, the front squeegee 413*c* is pressed against the mask plate 422, with the relatively small second load. In this way, at the place where the front squeegee 413*c* is pressed, the mask plate 422 is more softly compressed than in the above breaking step. When the flux F is filled into the pattern hole 422*a* by the front squeegee 413*c* moving as above, the flux F is applied with a certain thickness also onto the top portion of the precoated area 3. Also, the flux F is filled in the unevenness at the top portion of the precoated area 3. This further eases the mounting of an electronic component by the electronic component mounting apparatus 500.

The flux disposing step is executed preferably within 30 seconds after the execution of the breaking step, and more preferably within 10 seconds after the execution of the breaking step. In other words, the time duration from the end time of the breaking step to the start time of the flux disposing step is preferably within 30 seconds, more preferably within 10 seconds.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

The present disclosure is applicable to a mounting substrate manufacturing method and a flux applying device.

REFERENCE SIGNS LIST

1: substrate
2: land
3: precoated area
10: mounting substrate manufacturing apparatus
　11: substrate transfer line
　20: information processing device
　20N: local area network
　50: loader
　90: solder precoat forming device
　　100: solder paste supplying section
　　210: heating section
　　220: cooling section
　300: solder precoat inspection device
　400: flux applying device (flux disposing device)
　　401: pedestal
　　402: printing stage
　　403: printing stage moving mechanism
　　403*xy*θ: printing stage table
　　403*z*: printing stage lifting mechanism
　　404: lifting table
　　　404*a*: support member
　　　404*b*: holding block
　　405: backup unit
　　405*a*: backup lifting mechanism
　　406*a*: carry-in conveyor
　　406*b*: printing stage conveyor
　　406*c*: carry-out conveyor
　　407: side clamper
　　408: beam
　　411: support frame
　　412: printing head support beam
　　412*a*: linear motion guide mechanism
　　413: printing head
　　　413*a*: squeegee driving unit
　　　413*b*: rear squeegee (application unit)
　　　413*c*: front squeegee (application unit)
　　414: printing head moving mechanism
　　　414*a*: printing head motor
　　　414*b*: feed screw
　　　414*c*: nut part
　　415: camera X-axis beam
　　　415*a*: camera X-axis motor
　　　415*b*: feed screw
　　　415*d*: nut part 416: camera moving mechanism
　416a: camera Y-axis motor
　416b: feed screw
　416c: nut part
416X: camera X-axis moving mechanism
416Y: camera Y-axis moving mechanism
417: camera attachment base
418: first camera
419: second camera
422: mask plate
　422a: pattern hole
430: roller mechanism (pressing device)
　431: press cylinder
　432: roller (tool)
440: plate mechanism (pressing device)
　441: press cylinder
　442: horizontal plate (tool)
500: electronic component placing device
501: electronic component placing device
502: electronic component placing device 600: placed state inspection device
700: reflow device
800: substrate inspection device
900: unloader
F: flux

What is claimed is:

1. A mounting substrate manufacturing method for soldering a terminal of an electronic component to a land of a substrate, the method comprising:
　a paste disposing step of disposing a solder paste on the land;
　a melting and solidifying step of melting and solidifying the solder paste, to form a precoated area coated with solder, on the land;
　a breaking step of breaking a residue covering a surface of the precoated area by pressing a tool against the precoated area;
　a flux disposing step of disposing a flux on the precoated area;
　a component placement step of placing an electronic component on the substrate, with the terminal of the electronic component aligned with the precoated area; and
　a reflow step of heating the substrate to melt the precoated area, to solder the terminal to the land.

2. The mounting substrate manufacturing method according to claim 1, wherein in the breaking step, a top portion of the precoated area is made into a flat shape or an uneven shape, with a tool.

3. The mounting substrate manufacturing method according to claim 1, wherein
　the flux disposing step is executed with a flux disposing device for disposing a flux on a substrate, and
　the breaking step is executed with a pressing device included in the flux disposing device.

4. The mounting substrate manufacturing method according to claim 1, wherein the flux disposing step is executed within 30 seconds after the breaking step is executed.

5. A flux applying device for use in the mounting substrate manufacturing method of claim 1, and for applying a flux onto a precoated area coated with solder and formed on a substrate, by screen printing, the flux applying device comprising:
　a tool that is pressed against a residue covering a surface of the precoated area before applying the flux, to break the residue.

6. The flux applying device according to claim 5, further comprising:
　a mask covering a region of the substrate to be left unapplied with the flux, and having a pattern hole passing through the mask in a thickness direction of the mask;
　a printing head having at least one squeegee for applying the flux disposed on the mask to the precoated area through the pattern hole;
　a printing stage holding the substrate; and
　a horizontal movement mechanism for horizontally moving the tool with respect to the substrate held on the printing stage.

7. The flux applying device according to claim 6, further comprising:
　a camera for imaging the substrate, wherein
　the horizontal movement mechanism is a camera moving mechanism for horizontally moving the camera above the substrate held on the printing stage.

8. The flux applying device according to claim 6, wherein
　the flux applying device further comprises a printing head moving mechanism for moving the printing head in a horizontal direction with respect to the mask, or
　the tool is provided on the printing head, and the horizontal movement mechanism serves as the printing head moving mechanism.

9. The flux applying device according to claim 6, wherein
　the printing head has a first squeegee for applying the flux to the precoated area while horizontally moving in a first direction, and a second squeegee for applying the flux to the precoated area while horizontally moving in a second direction opposite to the first direction, and
　the tool is provided between the first squeegee and the second squeegee.

10. The flux applying device according to claim 6, further comprising a printing stage moving mechanism for horizontally moving the printing stage, and
　the horizontal movement mechanism is the printing stage moving mechanism.

11. The flux applying device according to claim 5, wherein the tool is a roller that moves horizontally with respect to the substrate.

12. The flux applying device according to claim 11, wherein the roller has unevenness on an outer peripheral surface of the roller.

13. The flux applying device according to claim 5, wherein the tool is a horizontal plate that moves vertically with respect to the substrate.

* * * * *